(12) United States Patent
Lanzillo et al.

(10) Patent No.: US 11,621,189 B2
(45) Date of Patent: Apr. 4, 2023

(54) BARRIER-LESS PREFILLED VIA FORMATION

(71) Applicant: INTERNATIONAL BUSINESS MACHINES CORPORATION, Armonk, NY (US)

(72) Inventors: Nicholas Anthony Lanzillo, Wynantskill, NY (US); Hosadurga Shobha, Niskayuna, NY (US); Junli Wang, Slingerlands, NY (US); Lawrence A. Clevenger, Saratoga Springs, NY (US); Christopher J. Penny, Saratoga Springs, NY (US); Robert Robison, Rexford, NY (US); Huai Huang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 118 days.

(21) Appl. No.: 17/377,541

(22) Filed: Jul. 16, 2021

(65) Prior Publication Data
US 2021/0343589 A1 Nov. 4, 2021

Related U.S. Application Data

(62) Division of application No. 16/744,254, filed on Jan. 16, 2020, now Pat. No. 11,152,257.

(51) Int. Cl.
*H01L 21/768* (2006.01)
*H01L 23/522* (2006.01)
*H01L 23/528* (2006.01)

(52) U.S. Cl.
CPC .... *H01L 21/76844* (2013.01); *H01L 21/7684* (2013.01); *H01L 21/76802* (2013.01);
(Continued)

(58) Field of Classification Search
CPC ......... H01L 21/76844; H01L 21/76802; H01L 21/7684; H01L 21/76849; H01L 21/76865;
(Continued)

(56) References Cited

U.S. PATENT DOCUMENTS

| 5,674,787 A | 10/1997 | Zhao et al. |
| 7,008,872 B2 | 3/2006 | Dubin et al. |

(Continued)

FOREIGN PATENT DOCUMENTS

WO 2019/226628 A1 11/2019

OTHER PUBLICATIONS

List of IBM Patents or Patent Applications Treated as Related dated Jul. 16, 2021, 2 pages.

(Continued)

*Primary Examiner* — Shahed Ahmed
*Assistant Examiner* — Vicki B. Booker
(74) *Attorney, Agent, or Firm* — Tutunjian & Bitetto, P.C.; Randy Emilio Tejeda

(57) ABSTRACT

A method for fabricating a semiconductor device includes forming one or more layers including at least one of a liner and a barrier along surfaces of a first interlevel dielectric (ILD) layer within a trench, after forming the one or more liners, performing a via etch to form a via opening exposing a first conductive line corresponding to a first metallization level, and forming, within the via opening and on the first conductive line, a barrier-less prefilled via including first conductive material.

20 Claims, 4 Drawing Sheets

(52) U.S. Cl.
CPC .. *H01L 21/76849* (2013.01); *H01L 21/76865* (2013.01); *H01L 21/76879* (2013.01); *H01L 23/5226* (2013.01); *H01L 23/5283* (2013.01)

(58) Field of Classification Search
CPC ........... H01L 21/76879; H01L 23/5226; H01L 23/5283
See application file for complete search history.

(56) References Cited

U.S. PATENT DOCUMENTS

| | | | |
|---|---|---|---|
| 7,585,768 | B2 | 9/2009 | Bu et al. |
| 9,324,650 | B2 | 4/2016 | Edelstein et al. |
| 10,177,028 | B1 | 1/2019 | LiCausi et al. |
| 2009/0079077 | A1 | 3/2009 | Yang et al. |
| 2011/0100697 | A1 | 5/2011 | Yang et al. |
| 2015/0179579 | A1* | 6/2015 | Jezewski ........... H01L 21/76846 438/644 |
| 2015/0270215 | A1 | 9/2015 | Peng et al. |
| 2016/0163587 | A1 | 6/2016 | Backes et al. |
| 2017/0186685 | A1* | 6/2017 | Yang ................. H01L 23/53214 |
| 2018/0090439 | A1 | 3/2018 | Liu et al. |
| 2021/0057273 | A1* | 2/2021 | Chen ................. H01L 21/76802 |
| 2021/0098295 | A1* | 4/2021 | Wang ................. H01L 21/76877 |

OTHER PUBLICATIONS

Jiang, et al., "Development of electroless Co via-prefill to enable advanced BEOL metallization and via resistance reduction", 2016 IEEE International Interconnect Technology Conference/Advanced Metallization Conference. May 23, 2016. (pp. 111-113.).

Van Der Veen, et al., "Cobalt Bottom-Up Contact and Via Prefill enabling Advanced Logic and DRAM Technologies", 2015 IEEE International Interconnect Technology Conference and 2015 IEEE Materials for Advanced Metallization Conference. May 18, 2015. (pp. 25-28.).

Zhao, et al., "Electroless Cobalt Via Pre-Fill Process for Advanced BEOL Metallization and Via Resistance Variation Reduction", 2018 IEEE International Interconnect Technology Conference (IITC). Jun. 4, 2018. (pp. 7-9.).

* cited by examiner

BARRIER-LESS PREFILLED VIA FORMATION

CROSS-REFERENCES TO RELATED APPLICATIONS

This application is a divisional application of and claims the priority benefit of U.S. patent application Ser. No. 16/744,254, filed Jan. 16, 2020, now allowed as U.S. Pat. No. 11,152,257— the entirety of which is incorporated by reference herein and made a part of this specification.

BACKGROUND

The present invention generally relates to semiconductor devices, and more particularly to barrier-less prefilled via formation.

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered schemes (e.g., single or dual damascene wiring structures) during the back-end-of-line (BEOL) phase of manufacturing. Within an interconnect structure, conductive vias can run perpendicular to the substrate and conductive lines can run parallel to the substrate.

SUMMARY

In accordance with an embodiment of the present invention, a method for fabricating a semiconductor device is provided. The method includes forming one or more layers including at least one of a liner and a barrier along surfaces of a first interlevel dielectric (ILD) layer within a trench, after forming the one or more liners, performing a via etch to form a via opening exposing a first conductive line corresponding to a first metallization level, and forming, within the via opening and on the first conductive line, a barrier-less prefilled via including first conductive material.

In accordance with another embodiment of the present invention, a method for fabricating a semiconductor device is provided. The method includes forming one or more layers including at least one of a liner and a barrier along surfaces of a first interlevel dielectric (ILD) layer within a trench, after forming the one or more layers, performing a via etch to form a via opening exposing a first conductive line corresponding to a first metallization level, forming, within the via opening and on the first conductive line, a barrier-less prefilled via including first conductive material in direct contact with the first conductive line, forming second conductive material on the barrier-less prefilled via and the one or more layers by performing a seed and plating process, and planarizing the second conductive material to form a second conductive line corresponding to a second metallization level in direct contact with the barrier-less prefilled via to reduce via resistance.

In accordance with yet another embodiment of the present invention, a semiconductor device is provided. The device includes a first conductive line corresponding to a first metallization level, a first cap layer disposed on the first conductive line, a first interlevel dielectric (ILD) layer disposed on the first cap layer, one or more layers including at least one of a liner and a barrier disposed along surfaces of the first ILD layer within a trench, a second conductive line corresponding to a second metallization level disposed on the one more layers, a barrier-less prefilled via disposed in direct contact with the first and second conductive lines, a second cap layer disposed across the first ILD layer, the one or more layers and the second conductive line, and a second ILD layer disposed on the second cap layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
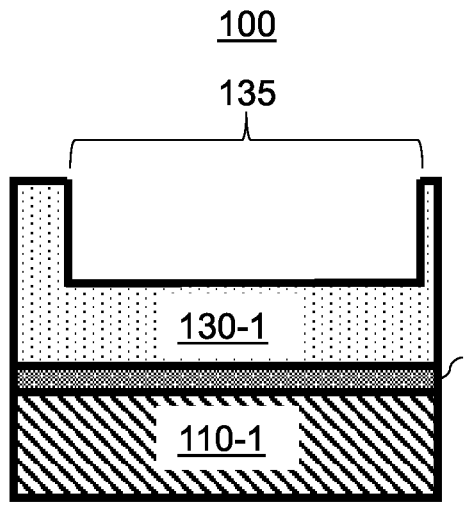
FIG. 1 is a cross-sectional view of the formation of a trench in an interlevel dielectric (ILD) layer during the fabrication of a semiconductor device, in accordance with an embodiment of the present invention.

The embodiments described herein provide for the formation of barrier-less prefilled conductive vias or vias.

Illustratively, the vias can include self-aligned vias. More specifically, the embodiments described herein can obviate the need for a barrier interface (e.g., barrier metal) that can result in a high resistance via and can back-end-of-line (BEOL) performance. This is achieved by forming one or more layers including a liner and/or barrier after the formation of a first conductive line ("line") and prior to the formation of a via opening, such that there is a lack of the one or more layers along the surfaces of the via opening. Then, conductive material can be formed in the via opening to form a via having a geometry (e.g., rounded top or rectangle). Additional processing can then be performed to form a second line in contact with the via. The embodiments described herein can be used to maximize contact area and to improve via yield by, e.g., avoiding high aspect ratio via fill and seed reflow.

A device described herein can include multiple metallization levels ("levels"), each including a conductive line ("line") formed in an interlevel dielectric layer (ILD). The upper lines can be connected to immediately lower adjacent lines by vias. Levels can be identified herein using the designation X, where X is a positive integer from 1 to N. The levels can be identified from the level closest to the substrate to the level furthest from the substrate as 1 through N where 1 is the first or lowermost level and N is the last or uppermost level. A line in the X level can be designated as an $M_X$ line, and a via in the X level can be designated as a $V_{X-1}$ via. Note that there are no $V_0$ vias or via bars. When a line in an upper level is designated as an $M_X$ line, then a line in the next lower level can be designated $M_{X-1}$. Likewise, when a line in a lower level is designated $M_X$, then a line in the next higher level can be designated $M_{X+1}$. For a first metallization level (X=1) and the corresponding $M_1$ line, there are no "$V_0$" vias as the connection from $M_1$ to devices below $M_1$ can be made through separately formed contacts in a contact layer ("CA"). For a second metallization level (X=2) and the corresponding $M_2$ line, there are $V_1$ vias or via bars and, for a third metallization level (X=3) and the corresponding $M_3$ line, there are $V_2$ vias or via bars. The lines described herein can be, e.g., single-damascene lines for X=1, or dual-damascene lines for X≥2.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which can include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xG_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, cross-sectional view of a semiconductor device 100 is provided.

As shown, a line 110-1 is formed. The line 110-1 can be an $M_{X-1}$ line within the device 100. The line 110-1 can include any suitable conductive material in accordance with the embodiments described herein (e.g., a metal). Examples of suitable materials for the line 110-1 include, but are not limited to, copper (Cu), tungsten (W), cobalt (Co) and aluminum (Al).

As further shown, a cap layer 120-1 is formed on the line 110-1. The cap layer 120-1 can include any suitable material in accordance with the embodiments described herein.

As further shown, an interlevel dielectric (ILD) layer 130-1 is formed, and a trench 135 is formed in the ILD layer 130-1 using any suitable process in accordance with the embodiments described herein. The ILD layer 130-1 can include any suitable material in accordance with the embodiments described herein (e.g., silicon dioxide ($SiO_2$)).

Figure 2:
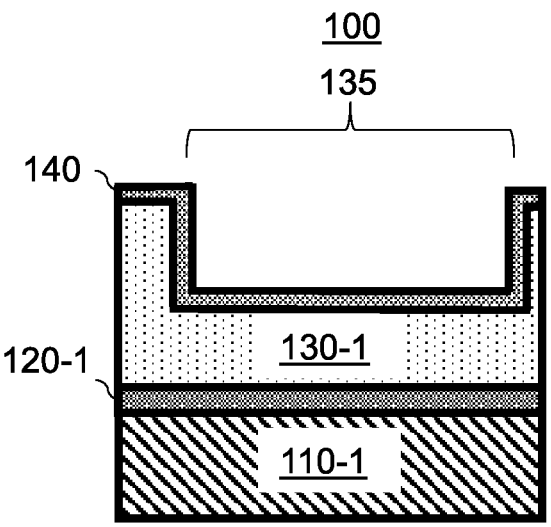
FIG. 2 is a cross-sectional view of the formation of one or more layers along the ILD layer during the fabrication of the semiconductor device, in accordance with an embodiment of the present invention.

With reference to FIG. 2, a layer 140 including a liner and/or barrier 140 is formed on the ILD layer 130-1 using any suitable process in accordance with the embodiments described herein. For example, the layer 140 can be conformally deposited along the ILD layer 130-1 (e.g., using atomic layer deposition (ALD)). The layer 140 can include any suitable material in accordance with the embodiments described herein. Examples of suitable materials include, but are not limited to, tantalum nitride (TaN), ruthenium (Ru), cobalt (Co) and tantalum (Ta). However, any other suitable materials may be used. Additionally, in some embodiments, the layer 140 can include multiple layers.

It is noted that the layer 140 is formed after the formation of the line 110-1, the cap layer 120-1, the ILD layer 130-1 and the trench 135. As will be described in further detail below, forming the layer 140 in such a manner can enable the formation of a via opening lacking the layer 140 along its surfaces. This lack of material can improve electrical conductivity within the device 100.

Figure 3:
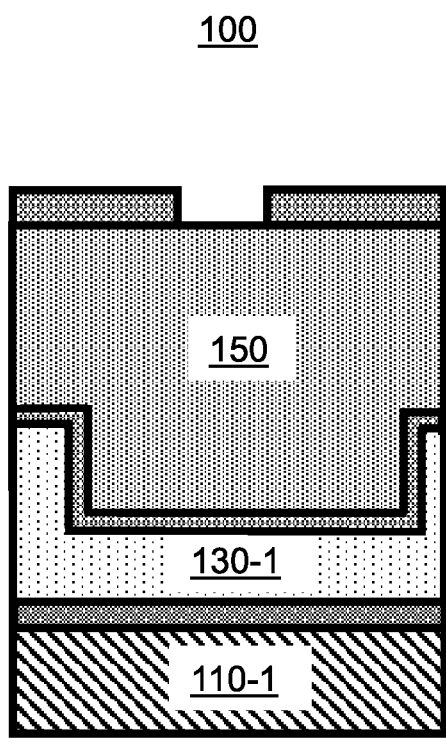
FIG. 3 is a cross-sectional view of the formation of lithographic material used to form a via opening during the fabrication of the semiconductor device, in accordance with an embodiment of the present invention.

With reference to FIG. 3, lithography material is formed on the layer 140. More specifically, an organic dielectric layer (ODL) 150 is formed on the layer 140, and a photoresist/hardmask 160 is formed on the ODL 150. The ODL 150 and the hardmask 160 can include any suitable materials in accordance with embodiments described herein.

Figure 4:
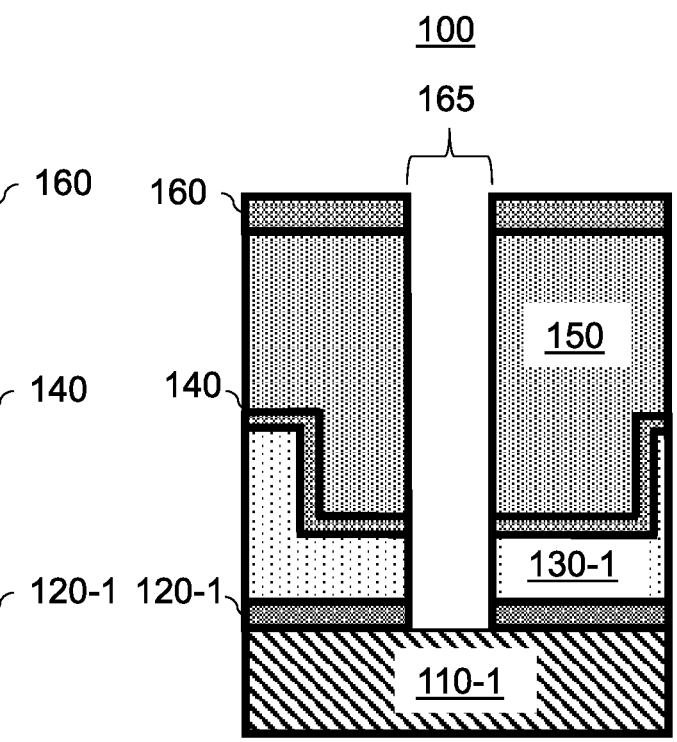
FIG. 4 is a cross-sectional view of a via etch to form the via opening during the fabrication of the semiconductor device, in accordance with an embodiment of the present invention.

With reference to FIG. 4, a via etch is performed to form a via opening 165 to the line 110-1. The via etch removes a portion of the layer 140 corresponding to the via opening 165. As will be described in further detail below, this process can allow for the formation of a line directly on top of a via formed within the via opening 165 without any interface therebetween. The via opening 165 can be formed using any suitable patterning process in accordance with the embodiments described herein.

Figures 5, 6:
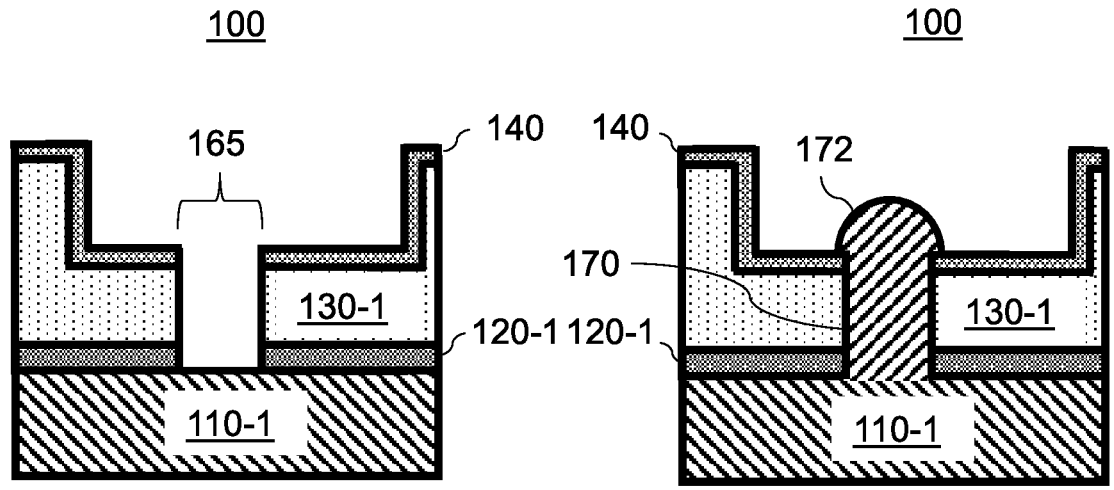
FIG. 5 is a cross-sectional view of the removal of the lithographic material during the fabrication of the semiconductor device, in accordance with an embodiment of the present invention.
FIG. 6 is a cross-sectional view of the formation of conductive material within the via opening to form a via prefill during the fabrication of the semiconductor device, in accordance with an embodiment of the present invention.

With reference to FIG. 5, the lithography material is removed (e.g., stripped or ashed). Any suitable process can be used to remove the lithography material in accordance with the embodiments described herein.

Now that a via opening 165 has been formed, conductive material (e.g., metal) can be formed in the via opening 165 to form a via. In one embodiment, as will be described below with reference to FIGS. 6-8, the conductive material can be formed to have a top with a circular-shaped or dome-shaped profile. In another embodiment, as will be described below with reference to FIGS. 9-11, the conductive material can be formed to have a rectangular-shaped profile. However, the conductive material can be formed to have any suitable shape in accordance with the embodiments described herein.

With reference to FIG. 6, a prefilled via ("via") 170 (e.g., a $V_{X-1}$ via) is formed by filling the via opening 165 with conductive material. As used herein, a "prefilled via" is a via that is formed by filling the via opening with conductive material before the line above the via is formed. This is in contrast to processes in which a via is formed by filling the via opening and the line above the via with conductive material during the same processing step (e.g., a dual damascene process). Via prefilling can be used to improve via yield (e.g., avoid high aspect ratio via fill and seed reflow). The via 170 can include any suitable conductive material in accordance with the embodiments described herein. Examples of suitable conductive materials for the via 170 include, but are not limited to, ruthenium (Ru), cobalt (Co), etc.

More specifically, the via 170 can be formed having a protrusion 172 at the top of the via 170 extending to a height above the via opening 165. The via 170 can be formed using any suitable process in accordance with the embodiments described herein (e.g., selective deposition). The protrusion 172 can have any suitable shape in accordance with the embodiments described herein.

For example, in one embodiment, the protrusion 172 can have a top with a convex-shaped profile. For example, as shown in FIG. 6, the protrusion 172 have a circular-shaped profile in contact with the layer 140. As another example, the protrusion 172 can have a conical-shaped profile.

In another embodiment, the protrusion 172 can have a top with a concave-shaped profile. For example, the protrusion 172 can include a divot formed within a top of the via 170.

In another embodiment, the protrusion 172 can have a flat top. In this embodiment, the via 170 can have a rectangular shape including a bottom surface, a top surface, and two side surfaces.

In another embodiment, the protrusion 172 can have a flat top with faceted corners. In this embodiment, the via 170 can have a hexagonal shape including a bottom surface, two side surfaces, a top surface, and the two angled surfaces connecting the top surface to respective ones of the two side surfaces.

As will be described in further detail below, the protrusion 172 can provide "gouging" to maximize the contact area between the via 170 and conductive material formed on the via 170 used to form another conductive line. Generally, "gouging" can refer to a situation arising from the formation of the conductive material (e.g., selective growth) in which a via is over-etched, resulting in a protrusion (e.g., convex-shaped protrusion) being located at the bottom of the via 170 and within the line 110-1. However, as described herein, the protrusion 172 is present at the top of the via 170 rather than at the bottom of the via 170.

Figures 7, 8:
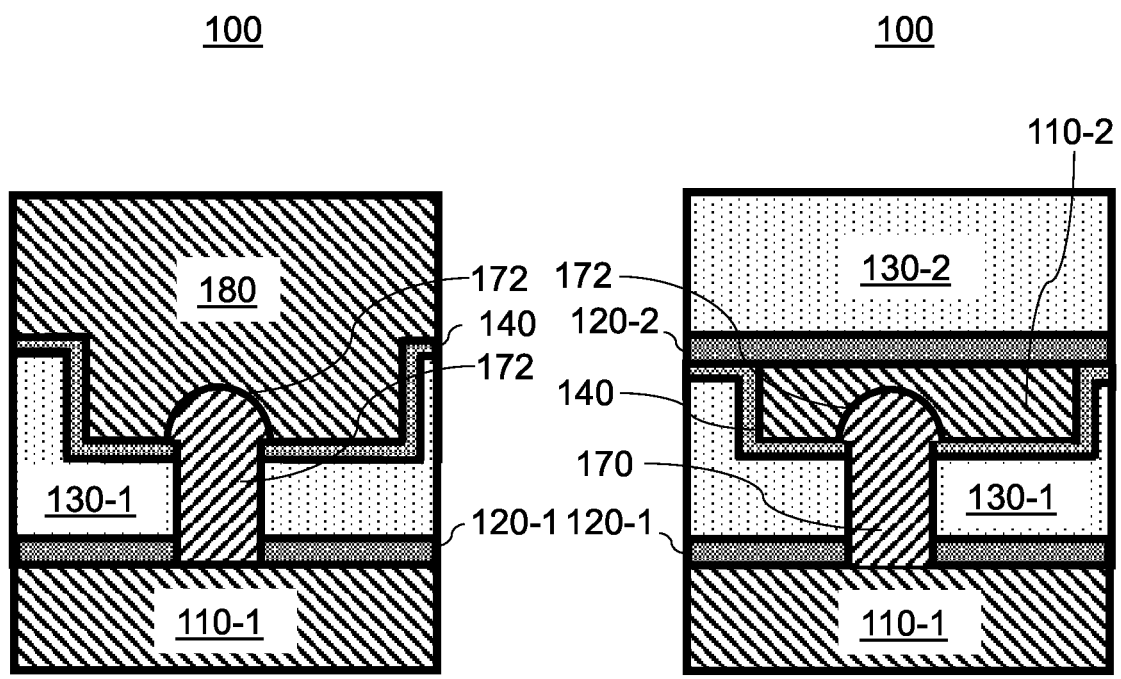
FIG. 7 is a cross-sectional view of seed and plating during the fabrication of the semiconductor device, in accordance with an embodiment of the present invention.
FIG. 8 is a cross-sectional view of the formation of a next level conductive line and ILD layer during the fabrication of the semiconductor device, in accordance with an embodiment of the present invention.

With reference to FIG. 7, conductive material 180 is formed on the via 170 and the layer 140. The conductive material 180 is deposited directly on top of the via 170 without any interface therebetween. The conductive material 180 can include any suitable material in accordance with the embodiments described herein (e.g., a metal). Examples of suitable materials for the conductive material 180 include, but are not limited to, copper (Cu), tungsten (W), cobalt (Co) and aluminum (Al).

With reference to FIG. 8, the conductive material 180 is planarized to form a line 110-2.

As a result of the lack of material along the exposed surfaces of the via opening 165 shown in FIG. 5 (e.g., sidewalls and bottom surface), the via 170 lacks material that would create a barrier at the interface with the lines 110-1 and 110-2. More specifically, the via 170 is prefilled with a conductive material resulting in a barrier-less prefilled via that is in direct contact with the lines 110-1 and 110-2. Such direct contact can reduce via resistance. For example, for a representative technology at the 5 nm technology node, eliminating the barrier (e.g., TaN barrier) between the via 170 and the lines 110-1 and 110-2 can reduce via resistance by, e.g., about 50%.

Additionally, the protrusion 172 of the via 170 can gouge into line 110-2 above to provide further via resistance reduction. This reduction can depend on factors including, e.g., gouging height. The circular-shaped profile can maximize the contact area between the via 170 and the line 110-2, thereby minimizing resistance.

As further shown, a cap layer 120-2 is formed across the ILD layer 130-1, the layer 140 and the line 110-2, and an ILD layer 130-2 is formed on the cap layer 120-2. The cap layer 120-2 can include the same or different material as the cap layer 120-1, and the ILD layer 130-2 can include the same or different material as the ILD layer 130-1.

The embodiment described above with reference to FIGS. 1-8 can utilize a selective deposition process to form a via having a circular-shaped profile within a via opening. In an alternative embodiment, as will now be described below with reference to FIGS. 9-11, a via having with a top with a rectangular-shaped profile can result if the via is formed in the via opening using a different conductive material formation process. Such a rectangular-shaped profile can correspond to a higher via resistance relative to the circular-shaped profile of the embodiment described above with reference to FIGS. 1-8 due to the smaller contact area between the via and the line.

Figure 9:
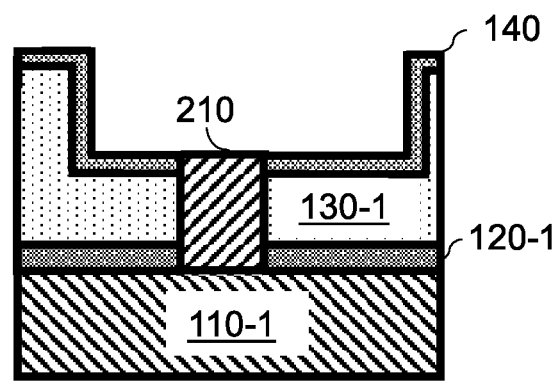
FIG. 9 is a cross-sectional view of the formation of conductive material within the via opening to form a via prefill during the fabrication of the semiconductor device, in accordance with another embodiment of the present invention.

With reference to FIG. 9, a semiconductor device 200 is shown. It is assumed that the device 200 has underwent the processing described above with reference to FIGS. 1-5 to form a via opening 165 that lacks liner or barrier material along the sidewalls and bottom surface.

As shown in FIG. 9, a prefilled via 210 (e.g., a $V_{X-1}$ via) is formed within the via opening 165. The via 210 is formed to include a top with a rectangular-shaped profile having an upper surface coplanar with the surface of the layer 140 disposed on the ILD layer 130-1 by filling the via opening 165 with conductive material. The via 210 can include any suitable conductive material in accordance with the embodiments described herein. Examples of suitable conductive materials for the via 210 include, but are not limited to, ruthenium (Ru), cobalt (Co), etc.

Figures 10, 11:
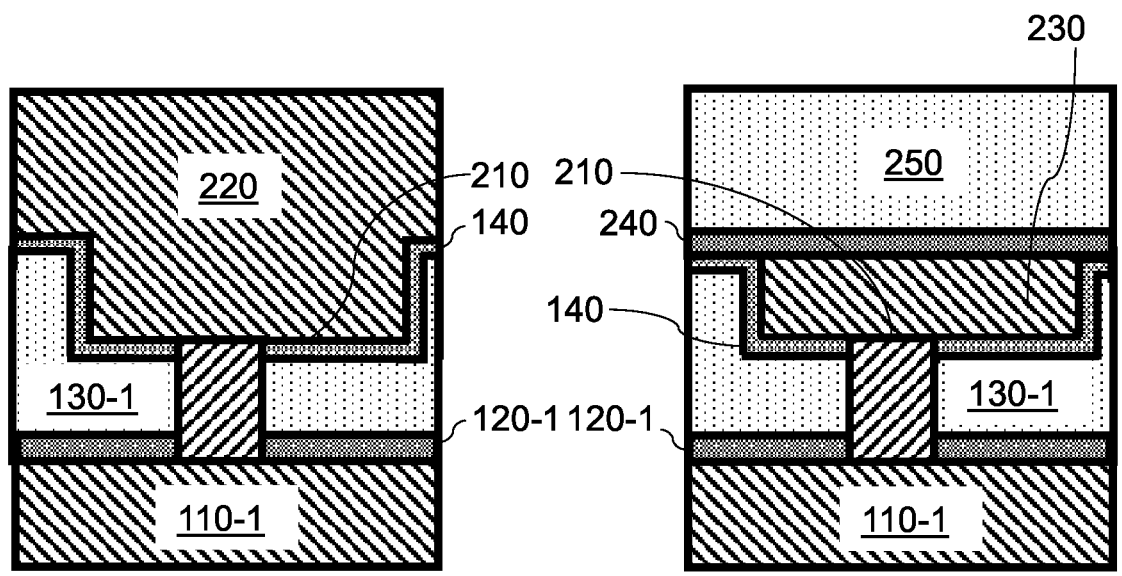
FIG. 10 is a cross-sectional view of seed and plating during the fabrication of the semiconductor device, in accordance with another embodiment of the present invention.
FIG. 11 is a cross-sectional view of the formation of conductive material within the via opening to form a via prefill during the fabrication of the semiconductor device, in accordance with another embodiment of the present invention.

With reference to FIG. 10, conductive material 220 is formed on the via 210 and the layer 140. The conductive material 220 is deposited directly on top of the via 210 without any interface therebetween. The conductive material 220 can include any suitable material in accordance with the embodiments described herein (e.g., a metal). Examples of suitable materials for the conductive material 220 include, but are not limited to, copper (Cu), tungsten (W), cobalt (Co) and aluminum (Al).

With reference to FIG. 11, the conductive material 180 is planarized to form a line 230. As can be seen, the via 210 lacks a barrier at the interface with the line 110-2. More specifically, as described above, the via 210 is prefilled with a conductive material resulting in a barrier-less prefilled via. Direct contact between the via 210 and the lines 110-1 and 230 reduces via resistance. For example, for a representative technology at the 5 nm technology node, eliminating the barrier (e.g., TaN barrier) between the via 170 and the lines 110-1 and 110-2 can reduce via resistance by, e.g., about 50%.

As further shown, a cap layer 240 is formed across the ILD layer 130-1, the layer 140 and the line 230, and an ILD layer 250 is formed on the cap layer 240. The cap layer 240 can include the same or different material as the cap layer 120-1, and the ILD layer 250 can include the same or different material as the ILD layer 130-1.

Figure 12:
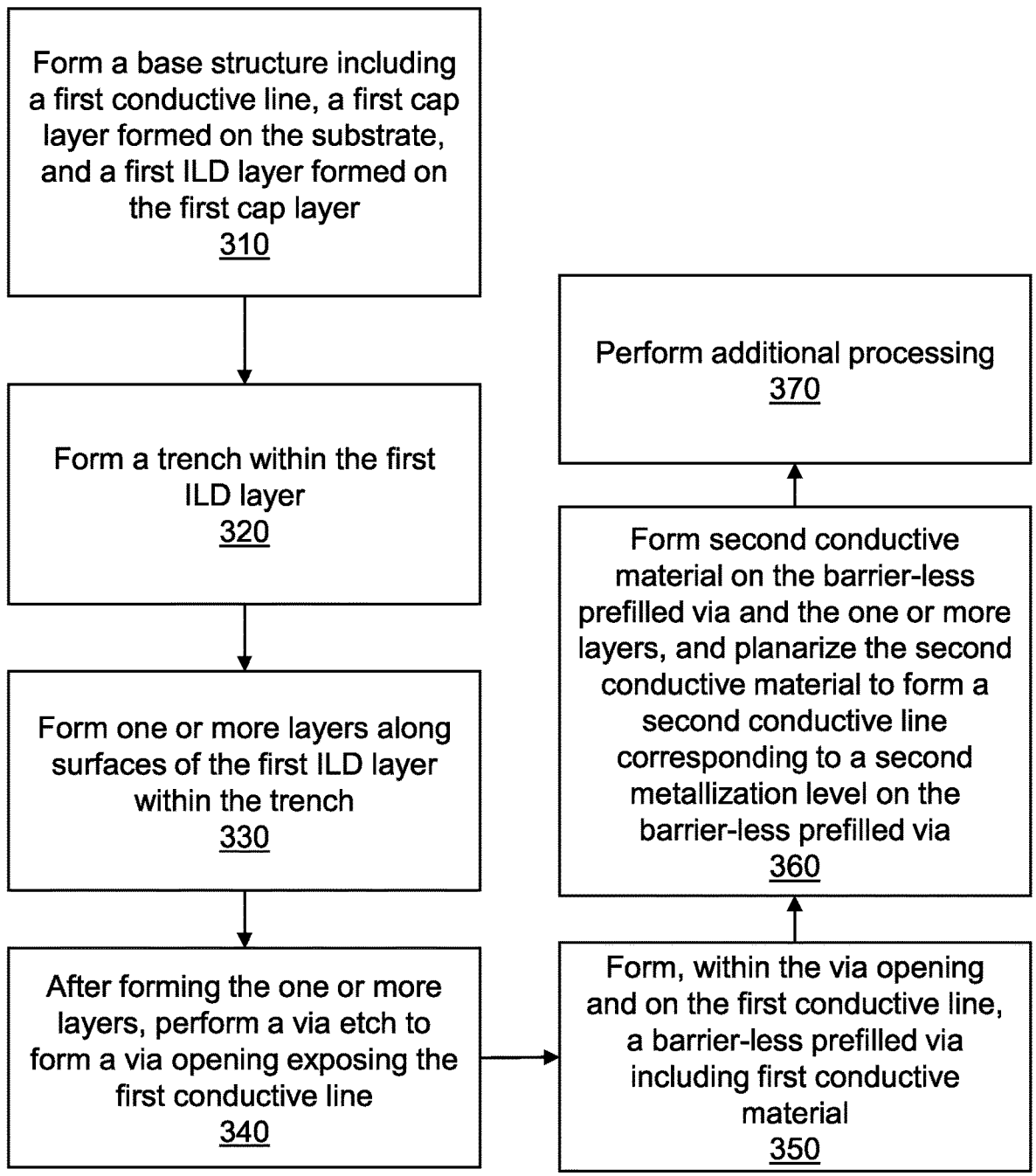
FIG. 12 is a block/flow diagram illustrating a system/method for fabricating a semiconductor device, in accordance with an embodiment of the present invention.

With reference to FIG. 12, a block/flow diagram is shown illustrating a system/method 300 for fabricating a semiconductor device.

At block 310, a base structure including a first conductive line corresponding, a first cap layer formed on the first conductive line, and a first interlevel dielectric (ILD) layer formed on the first cap layer is formed. The first conductive line can correspond to a first metallization level (e.g., a $M_{X-1}$ line) within the device.

At block 320, a trench is formed within the first ILD layer. Any suitable process can be used to form the trench in accordance with the embodiments described herein.

Further details regarding blocks 310 and 320 are described above with reference to FIG. 1.

At block 330, one or more layers are formed along surfaces of the first ILD layer within the trench. The one or more layers can include at least one liner and/or at least one barrier. For example, the one or more layers can be conformally deposited along sidewalls and a bottom surface of the first ILD layer (e.g., using atomic layer deposition (ALD)). Further details regarding block 330 are described above with reference to FIG. 2.

At block 340, a via etch is performed to form a via opening exposing the first conductive line. Performing the via etch to form the via opening can include forming lithography material on the one or more layers, using the lithography material to form the via opening to expose the first conductive line, and removing the lithography material after forming the via opening. More specifically, the lithography material can include an organic dielectric layer (ODL) is formed on the one or more layers, and a photoresist/hardmask is formed on the ODL. The via opening can be formed using any suitable patterning/etch process in accordance with the embodiments described herein, and the lithography material can be removed (e.g., stripped and/or ashed) using any suitable process in accordance with the embodiments described herein. Further details regarding block 340 are described above with reference to FIGS. 3-5.

At block 350, a barrier-less prefilled via including first conductive material is formed within the via opening and on the first conductive line. The barrier-less prefilled via can be formed in direct contact with the first conductive line.

In one embodiment, the barrier-less prefilled via can be formed having a protrusion at the top of the barrier-less prefilled via extending to a height above the via opening. The barrier-less prefilled via can be formed using any suitable process in accordance with the embodiments described herein (e.g., selective deposition). Gouging resulting from protrusion can provide for additional resistance reduction after the formation of second conductive material on the barrier-less prefilled via. The protrusion can have any suitable shape in accordance with the embodiments described herein.

For example, in one embodiment, the protrusion can have a top with a convex-shaped profile. For example, the protrusion have a circular-shaped profile in contact with the one or more layers. As another example, the protrusion can have a conical-shaped profile.

In another embodiment, the protrusion can have a top with a concave-shaped profile. For example, the protrusion can include a divot formed within a top of the via.

In another embodiment, the protrusion can have a flat top. In this embodiment, the via can have a rectangular shape including a bottom surface, a top surface, and two side surfaces.

In another embodiment, the protrusion can have a flat top with faceted corners. In this embodiment, the via can have a hexagonal shape including a bottom surface, two side surfaces, a top surface, and the two angled surfaces connecting the top surface to respective ones of the two side surfaces.

In an alternative embodiment, the conductive material can be formed to have a rectangular-shaped profile with the via opening that lacks a protrusion.

Further details regarding block 350 are described above with reference to FIGS. 6 and 9.

At block 360, a second conductive material is formed on the barrier-less prefilled via and the one or more layers, and the second conductive material is planarized to form a second conductive line corresponding to a second metallization layer (e.g., a $M_X$ line). The barrier-less prefilled via can be formed in direct contact with the second conductive line. Forming the second conductive material can include performing a seed and plating process. Further details regarding block 370 are described above with reference to FIGS. 7 and 10.

At block 370, additional processing is performed. Performing the additional processing can include forming a second cap layer across the first ILD layer, the one or more layers and the second conductive line, and forming a second ILD layer on the second cap layer. The second cap layer can include the same or different material as the first cap layer, and the second ILD layer can include the same or different material as the first ILD layer.

Direct contact between the barrier-less prefilled via and the first and second conductive lines can reduce via resistance. For example, for a representative technology at the 5 nm technology node, eliminating the barrier (e.g., TaN barrier) between the via 170 and the lines 110-1 and 110-2 can reduce via resistance by, e.g., about 50%. In the embodiment in which the conductive material of the via is formed having a circular-shaped profile, the barrier-less prefilled via can gouge into the second conductive line above to provide further via resistance reduction. This reduction can depend on factors including, e.g., gouging height.

Further details regarding block 380 are described above with reference to FIGS. 8 and 11.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:
    forming one or more layers including at least one of a liner and a barrier along surfaces of a first interlevel dielectric (ILD) layer within a trench;
    after forming the one or more layers, performing a via etch to form a via opening exposing a first conductive line corresponding to a first metallization level; and
    forming, within the via opening and on the first conductive line, a barrier-less prefilled via including first conductive material.

2. The method of claim 1, further comprising:
    forming a base structure including the first conductive line, a first cap layer formed on the first conductive line, and the first ILD layer formed on the first cap layer; and
    forming the trench within the first ILD layer.

3. The method of claim 1, wherein performing the via etch to form the via opening further includes:
    forming lithography material on the one or more layers;
    using the lithography material to form the via opening to expose the first conductive line; and
    removing the lithography material after forming the via opening.

4. The method of claim 1, further comprising:
    forming second conductive material on the barrier-less prefilled via and the one or more layers by performing a seed and plating process; and
    planarizing the second conductive material to form a second conductive line corresponding to a second metallization level in direct contact with the barrier-less prefilled via to reduce via resistance.

5. The method of claim 4, wherein the barrier-less prefilled via includes a protrusion extending to a height above the via opening, the protrusion gouging into the second conductive line to further reduce via resistance.

6. The method of claim 5, wherein forming the barrier-less prefilled via further includes forming the first conductive material to have a rectangular-shaped profile within the via opening.

7. The method of claim 4, wherein forming the barrier-less prefilled via further includes forming the first conductive material to have a top with a rectangular-shaped profile within the via opening.

8. The method of claim 4, further comprising forming a second cap layer across the first ILD layer, the one or more layers and the second conductive line.

9. The method of claim 8, further comprising forming a second ILD layer on the second cap layer.

10. The method of claim 9, further comprising:
forming a base structure including the first conductive line, a first cap layer formed on the first conductive line, and the first ILD layer formed on the first cap layer; and
forming the trench within the first ILD layer;
wherein performing the via etch to form the via opening further includes:
forming lithography material on the one or more layers;
using the lithography material to form the via opening to expose the first conductive line; and
removing the lithography material after forming the via opening.

11. The method of claim 10, wherein the barrier-less prefilled via includes a protrusion extending to a height above the via opening, the protrusion gouging into the second conductive line to further reduce via resistance.

12. The method of claim 11, wherein forming the barrier-less prefilled via further includes using a selective deposition process to form the protrusion having a top with a circular-shaped profile within the via opening.

13. A method for fabricating a semiconductor device, comprising:
forming one or more layers including at least one of a liner and a barrier along surfaces of a first interlevel dielectric (ILD) layer within a trench;
after forming the one or more layers, performing a via etch to form a via opening exposing a first conductive line corresponding to a first metallization level;
forming, within the via opening and on the first conductive line, a barrier-less prefilled via including first conductive material in direct contact with the first conductive line;
forming second conductive material on the barrier-less prefilled via and the one or more layers by performing a seed and plating process; and
planarizing the second conductive material to form a second conductive line corresponding to a second metallization level in direct contact with the barrier-less prefilled via to reduce via resistance.

14. The method of claim 13, wherein forming the barrier-less prefilled via further includes forming the first conductive material to have a rectangular-shaped profile within the via opening.

15. The method of claim 13, further comprising forming a second cap layer across the first ILD layer, the one or more layers and the second conductive line.

16. The method of claim 15, further comprising forming a second ILD layer on the second cap layer.

17. A method for fabricating a semiconductor device, comprising:
forming one or more layers including at least a barrier along surfaces of a first interlevel dielectric (ILD) layer within a trench formed in the first ILD layer;
after forming the one or more layers, performing a via etch to form a via opening exposing a first conductive line corresponding to a first metallization level; and
forming, within the via opening and on the first conductive line, a barrier-less prefilled via including first conductive material, the barrier-less prefilled via disposed in direct contact with the first conductive line.

18. The method of claim 17, further comprising forming a base structure including the first conductive line, a first cap layer formed on the first conductive line, and the first ILD layer formed on the first cap layer.

19. The method of claim 18, further comprising:
forming lithography material on the one or more layers; and
using the lithography material to form the via opening to expose the first conductive line.

20. The method of claim 19, further comprising removing the lithography material after forming the via opening.

* * * * *